United States Patent

Shirai et al.

Patent Number: 5,150,189
Date of Patent: Sep. 22, 1992

[54] SEMICONDUCTOR APPARATUS

[75] Inventors: Takahiro Shirai, Hiratsuka; Tsuneori Yoshinari, Tokyo; Kazuhiko Muto, Kawasaki, all of Japan

[73] Assignee: Canon Kabushiki Kaisha, Tokyo, Japan

[21] Appl. No.: 587,616

[22] Filed: Sep. 24, 1990

Related U.S. Application Data

[63] Continuation of Ser. No. 361,391, Jun. 5, 1989, abandoned, which is a continuation of Ser. No. 175,675, Mar. 25, 1988, abandoned, which is a continuation of Ser. No. 18,476, Feb. 25, 1987, abandoned.

[30] Foreign Application Priority Data

| Feb. 28, 1986 | [JP] | Japan | 61-44783 |
| Feb. 28, 1986 | [JP] | Japan | 61-44784 |
| Feb. 28, 1986 | [JP] | Japan | 61-44785 |
| Feb. 28, 1986 | [JP] | Japan | 61-44786 |

[51] Int. Cl.$^5$ .................................. H01L 29/40
[52] U.S. Cl. .............................. 357/53; 357/51; 357/71
[58] Field of Search .......... 357/53, 71, 23.7, 84, 357/51, 53; 330/149, 204; 174/268, 260; 331/101

[56] References Cited

U.S. PATENT DOCUMENTS

| 3,488,528 | 1/1970 | Emond | 357/303.1 |
| 4,035,829 | 7/1977 | Ipri et al. | 357/53 |
| 4,609,935 | 9/1986 | Kondo | 357/51 |
| 4,626,889 | 12/1986 | Yamamoto et al. | 357/51 |
| 4,805,138 | 2/1989 | McElroy | 357/53 |
| 4,825,278 | 4/1989 | Hillenius et al. | 357/53 |

FOREIGN PATENT DOCUMENTS

| 0055038 | 6/1982 | European Pat. Off. |
| 0079775 | 5/1983 | European Pat. Off. |
| 56-27962 | 3/1981 | Japan | 357/84 |
| 56-125868 | 10/1981 | Japan | 357/23.7 |
| 57-104243 | 6/1982 | Japan | 357/84 |
| 60-187038 | 9/1985 | Japan | 357/71 |
| 60-224244 | 11/1985 | Japan | 357/71 |
| 60-224246 | 11/1985 | Japan | 357/84 |
| 61-6868 | 1/1986 | Japan | 351/23.5 |

Primary Examiner—Andrew J. James
Assistant Examiner—Sara W. Crane
Attorney, Agent, or Firm—Fitzpatrick, Cella, Harper & Scinto

[57] ABSTRACT

In a semiconductor apparatus for processing low level signals, a signal line and a guard are formed on a substrate. The guard is arranged in one side or both sides of the signal line. The potential of the guard is set substantially equal to the potential of the signal line.

8 Claims, 7 Drawing Sheets

SEMICONDUCTOR APPARATUS

This application is a continuation of application Ser. No. 07/361,391 filed Jun. 5, 1989, now abandoned which is a continuation of application Ser. No. 07/175,675 filed Mar. 25, 1988, now abandoned, which is a continuation of application Ser. No. 07/018,476 filed Feb. 25, 1987, now abandoned.

BACKGROUND OF THE INVENTION

1. Field of the Invention

The present invention relates to a semiconductor apparatus having a signal line to transmit a signal on at least a substrate and, more particularly, to a semiconductor apparatus which can accurately transmit or process the signal even when the signal level falls in a very small range.

The semiconductor apparatus according to the invention is generally applied to apparatuses for transmitting or processing a signal of a very small level. For example, it is applied to an apparatus for processing a micro photo-current as an output of a photovoltaic device, or the like.

2. Related Background Art

In general, in the case of transmitting and processing a signal having a level in a very small range through a line, it is difficult or impossible to accurately transmit and process the signal because of leakage current from the line or a current flowing into the line from the outside For example, when the illumination is small and a photovoltaic current of a photodiode is very small, a variation occurs due to leakage current or the like in the output voltage which is derived by amplifying the output of the photodiode by a log amplifier, so that the accurate photoelectric converted output cannot be obtained (refer to FIG. 1). Therefore, hitherto, the signal has been adjusted by use of a correcting circuit which is additionally provided.

However, when the output voltage varies as shown in a hatched portion in FIG. 1, the fine correction becomes difficult and there is such a problem that the signal cannot be accurately processed. Further, particularly, in the apparatus having such a constitution as to receive a number of micro-level signals, the addition of the correcting circuit causes the circuit to be complicated and there are such problems that the manufacturing steps also become complicated in association with the complicated circuit and the manufacturing cost also increases.

SUMMARY OF THE INVENTION

It is an object of the present invention to provide a semiconductor apparatus in which by providing means for applying a predetermined potential at a location near a signal line, an obstacle in signal processing due to leakage current from the signal line or a current flowing into the signal line can be eliminated.

According to an embodiment of the invention, the means for applying a predetermined potential is accomplished by the guard means which is arranged on one side or both sides of the signal line or above and/ or below the signal line and which is set to substantially the same potential as the signal line.

According to another embodiment of the invention, the means for applying a predetermined potential is accomplished by the control electrode which is arranged on one side or both sides of the signal line or above and/or below the signal line and which is set to a predetermined constant potential.

DETAILED DESCRIPTION OF THE PREFERRED EMBODIMENTS

An embodiment of the present invention will be described in detail hereinbelow with reference to the drawings.

Figure 2:
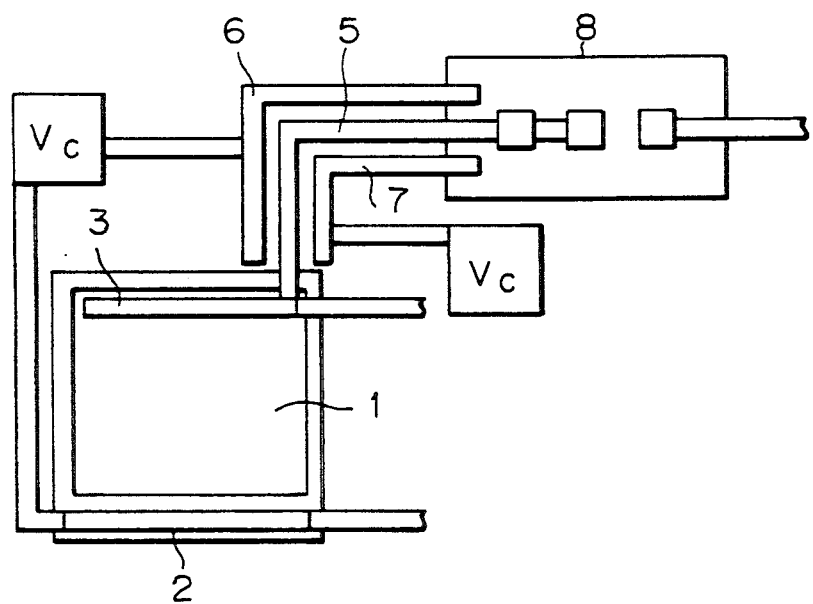
FIG. 2 is a schematic pattern constitutional diagram, with a part omitted, of a photo-sensor apparatus as an embodiment of a semiconductor apparatus according to the present invention.
Figure 3:
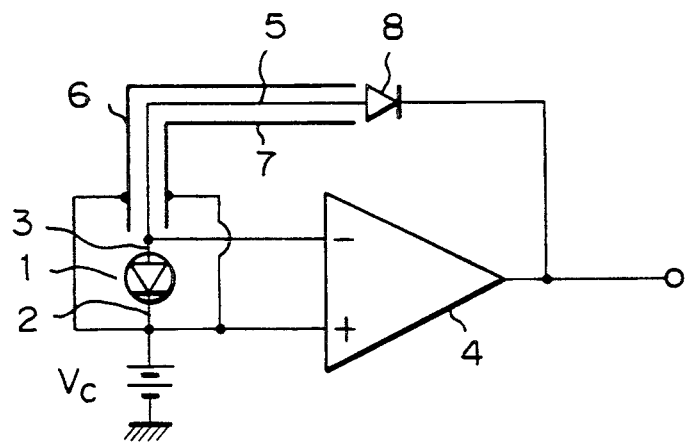
FIG. 3 is an equivalent circuit diagram of the embodiment.

FIG. 2 is a schematic pattern constitutional diagram, with a part omitted, of a photo-sensor apparatus as an embodiment of a semiconductor apparatus according to the present invention. FIG. 3 is an equivalent circuit diagram of FIG. 2.

This embodiment has a constitution in which a photodiode is connected to a log amplifier. Namely, in FIGS. 2 and 3, a cathode electrode 2 and an anode electrode 3 of a photodiode 1 are connected to a noninverting terminal and an inverting terminal of an operational amplifier 4, respectively. A reference voltage $V_c$ is applied to the cathode electrode 2. The anode electrode 3 is connected to a signal line 5.

Guard lines 6 and 7 are arranged in parallel with both sides of the signal line 5. The reference voltage $V_c$ is applied to each guard line.

The signal line 5 is connected to an output terminal of the operational amplifier 4 through a log diode 8, thereby constituting a log amplifier. In this case, the log diode in which the base and collector of a bipolar transistor are connected is used as the log diode 8.

With this constitution, when the lights enter the photodiode 1, a photo current flows through the signal line 5 to the log diode 8, so that the logarithm converted voltage appears to the output terminal of the operational amplifier 4. In this case, even if the level of photo current is very small, the inflow of leakage current and a current from the outside is prevented because the guard lines 6 and 7 having the same potential as the signal line are arranged on both sides of the signal line 5. Thus, the output voltage which accurately corresponds to the incident light amount appears to the output terminal of the operational amplifier 4 and the accuracy of the signal process is improved.

Figure 4:
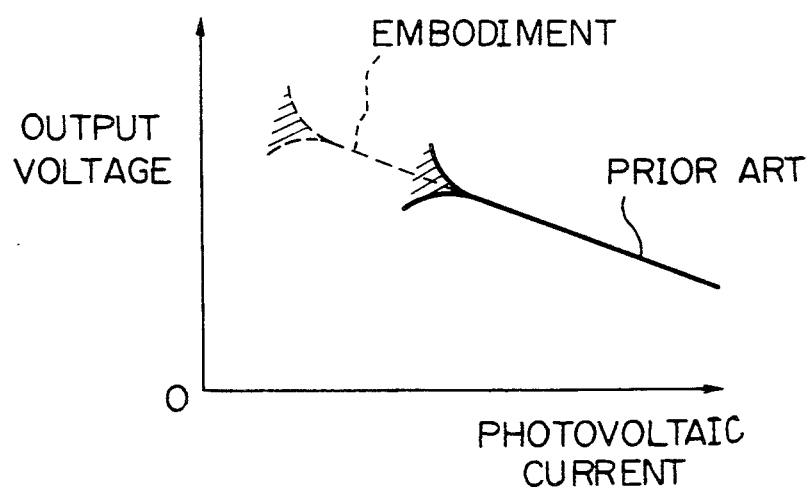
FIG. 4 is a graph showing schematically the output voltage characteristic to a photovoltaic current in each of the embodiment and the prior art.

FIG. 4 is a graph showing schematically the output voltage characteristic to the photovoltaic current in each of the embodiment and the prior art. It will be appreciated from the graph of the embodiment that by arranging the guard means in parallel with the signal line, even if the level of the photovoltaic current of the photodiode 1 is very small, the accurate output voltage can be obtained (the portion indicated by a broken line in FIG. 4) and the signal processing capability at the micro signal level is improved.

The invention is not limited to the foregoing embodiment but can be also applied to a semiconductor apparatus which intends to accurately transmit and process the micro-level signal.

As described in detail above, with the semiconductor apparatus according to the embodiment, by use of such a simple constitution that the guard means having substantially the same potential as the signal line are arranged in parallel with the signal line, the influences by the leak current, disturbance, and the like can be prevented. Even when the signal level is very small, the signal can be accurately transmitted and processed. Therefore, the correcting circuit which has conventionally been needed can be omitted and the constitution and manufacturing steps can be also simplified.

Figure 5:
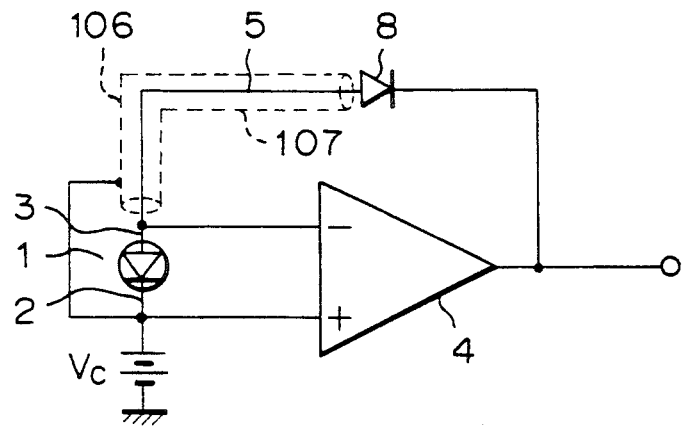
FIG. 5 is a schematic equivalent circuit diagram of the photosensor apparatus as another embodiment of the semiconductor apparatus according to the invention.

FIG. 5 is an equivalent circuit diagram of the photo sensor apparatus as another embodiment of the semiconductor apparatus according to the invention.

This embodiment has such a constitution that the photodiode is connected to the log amplifier. Namely, in FIG. 5, the cathode electrode 2 and anode electrode 3 of the photodiode 1 are connected to the noninverting terminal and inverting terminal of the operational amplifier 4, respectively. The reference voltage $V_c$ is applied to the cathode electrode 2. The anode electrode 3 is connected to the signal line 5.

Guard means 106 and/or 107 are arranged in parallel with both sides of the signal line 5. The reference voltage $V_c$ is applied to each guard means.

The signal line 5 is connected to the output terminal of the operational amplifier 4 through the log diode 8, thereby constituting a log amplifier. In this case, such a log diode that the base and collector of a bipolar tansistor are connected is used as the log diode 8.

With this constitution, when the lights enter the photodiode 1, the photovoltaic current flows through the signal line 5 to the log diode 8, so that the logarithm converted output voltage appears to the output terminal of the operational amplifier 4. In this case, even if the level of the photovoltaic current is very small, the inflow of leakage current and a current from the outside is prevented because the guard means 106 and/or 107 having the same potential as the potential of the signal line 5 are arranged above and/or below the signal line 5. Therefore, the output voltage which accurately corresponds to the incident light amount appears to the output terminal of the operational amplifier 4 and the accuracy of the signal process is improved.

FIGS. 6 to 10 are diagrammatical cross sectional views showing practical forms of the guard means in the embodiment, respectively.

Figure 6:
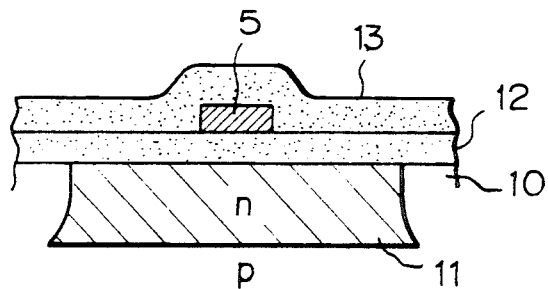
FIGS. 6 to 10 are diagrammatical cross sectional views showing practical forms of guard means in the embodiment, respectively.

In FIG. 6, a p-type semiconductor substrate 10 is formed with a diffusion layer 11 of an n-type semiconductor as the guard means. The metal signal line 5 made of aluminum or the like is formed on the diffusion layer 11 through an insulating layer 12. The signal line 5 and insulating layer 12 are covered by insulating layer 13, for example, passivation film made of PSG or the like.

The reference voltage $V_c$ is applied to the diffusion layer 11, so that a leakage current between the signal line 5 and the substrate 10 is prevented. If the substrate 10 is formed by the n-type semiconductor, the diffusion layer 11 for guard is formed by the p-type semiconductor. However, in this case, since the photodiode 1 is also formed onto the n-type substrate 10, the polarity of the reference voltage $V_c$ is also reversed.

Figure 7:
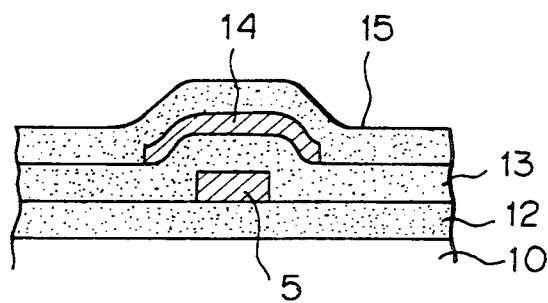

In FIG. 7, the signal line 5 is formed on the substrate 10 through the insulating layer 12. A metal layer 14 is further formed as the guard means through the insulating layer 13 between layers and covered by a passivation layer 15. By applying the reference voltage $V_c$ to the metal layer 14, the leak current which flows from the outside to the signal line 5 through the passivation layer 15 can be prevented.

Figure 8:
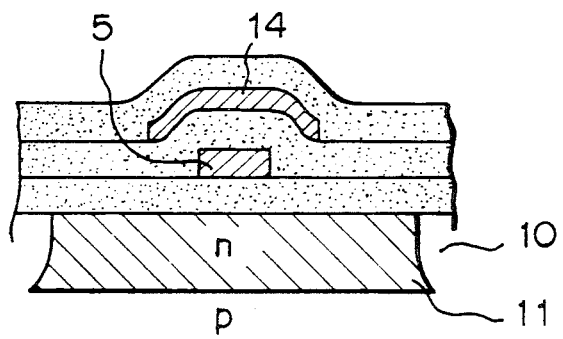

In the example shown in FIG. 8, the diffusion layer 11 and metal layer 14 are arranged above and below the signal line 5. By applying the reference voltage $V_c$ to both layers 11 and 14, the effect to prevent the leakage current is further improved.

Figure 9:
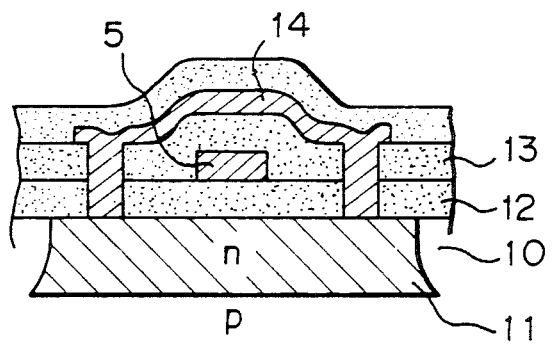

According to the example shown in FIG. 9, contact portions are formed to the insulating layer 12 and insulating layer 13 between layers. The diffusion layer 11 serving as the guard means and the metal layer 14 are connected through the contact portions, thereby surrounding the signal line 5. With this constitution, by applying the reference voltage $V_c$, the leakage current can be substantially prevented.

Figure 10:
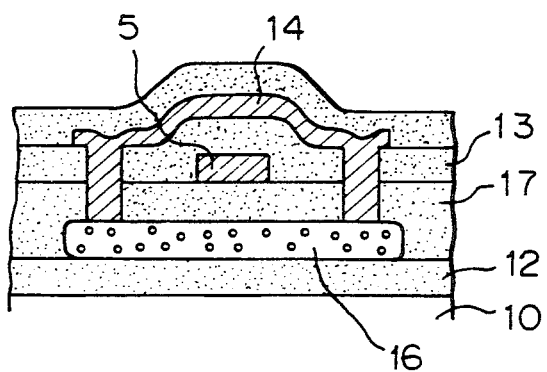

In the example shown in FIG. 10, the insulating layer 12 is formed on the substrate 10, and a conductive layer 16 for guard which is made of polysilicon, metal, or the like is formed on the insulating layer 12. An insulating layer 17 between layers, signal line 5, and insulating layer 13 between layers are formed on and over the conductive layer 16. Further, the metal layer 14 is formed on the insulating layer 13 and connected through the contact portions formed in the insulating layers 13 and 17 to the conductive layer 16 for guard which is formed below the metal layer 14. In this manner, by surrounding the signal line 5 and by applying the reference voltage $V_c$, the leakage current can be also prevented.

FIG. 4 shows the output voltage characteristic to the photovoltaic current in each of the embodiment and the prior art. By arranging the guard means in parallel with the signal line as in the foregoing embodiment, even if the level of photovoltaic current of the photodiode 1 is very small, the accurate output voltage can be obtained (the portion indicated by a broken line in FIG. 4) and the signal processing capability at the micro signal level can be improved.

As described in detail above, in the semiconductor apparatus according to the embodiment, with such a simple constitution that the guard means having substantially the same potential as the signal line are arranged above and/or below the signal line, the influences by the leakage current and disturbance and the like can be prevented. Even if the signal level is very small, the signal can be accurately transmitted and processed. Therefore, the correcting circuit which has conventionally been needed can be omitted and the constitution and manufacturing steps can be also simplified.

Figure 11:
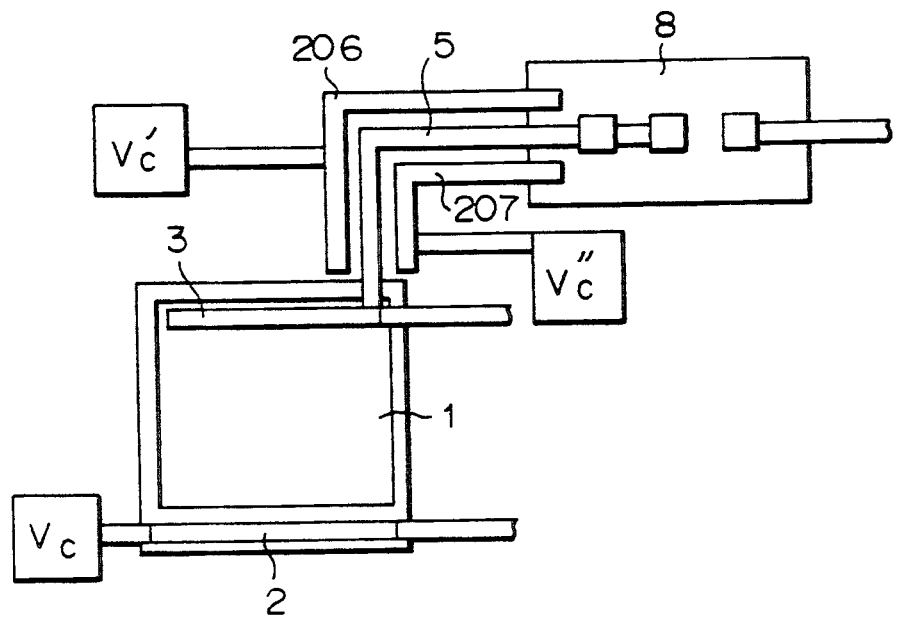
FIG. 11 is a schematic pattern constitutional diagram, with a part omitted, of the photo-sensor apparatus as still another embodiment of the semiconductor apparatus according to the invention.
Figure 12:
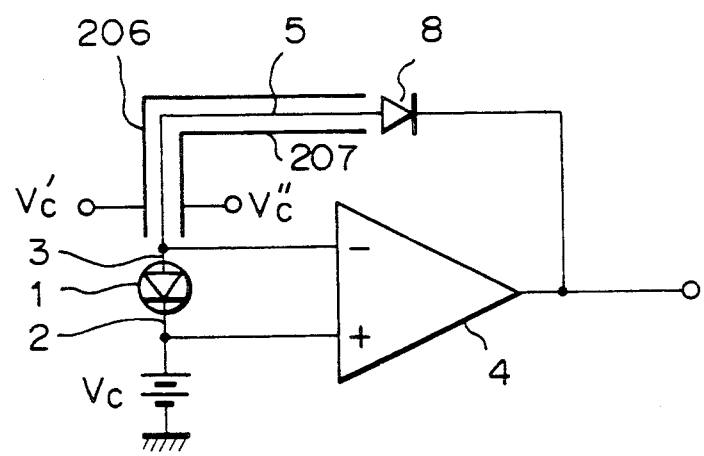
FIG. 12 is an equivalent circuit diagram of the embodiment.

FIG. 11 is a schematic pattern constitutional diagram, with a part omitted, of the photo sensor apparatus as still another embodiment of the semiconductor apparatus according to the invention. FIG. 12 is an equivalent circuit diagram of FIG. 11.

This embodiment has such a constitution that the photodiode is connected to the log amplifier. Namely, in FIGS. 11 and 12, the cathode electrode 2 and anode electrode 3 of the photodiode 1 are connected to the noninverting terminal and inverting terminal of the operational amplifier 4, respectively. The reference voltage $V_c$ is applied to the cathode electrode 2. The anode electrode 3 is connected to the signal line 5.

Control electrode lines 206 and 207 are arranged in parallel with both sides of the signal line 5. Constant voltages $V_c'$ and $V_c''$ are applied to the control electrode lines, respectively.

The signal line 5 is connected to the output terminal of the operational amplifier 4 through the log diode 8, thereby constituting a log amplifier. In this case, such a log diode that the base and collector of a bipolar tansistor are connected is used as the log diode 8.

With this constitution, when the lights enter the photodiode 1, a photovoltaic current flows through the signal line 5 to the log diode 8, so that the logarithm converted output voltage appears to the output terminal of the operational amplifier 4.

Figure 13A:
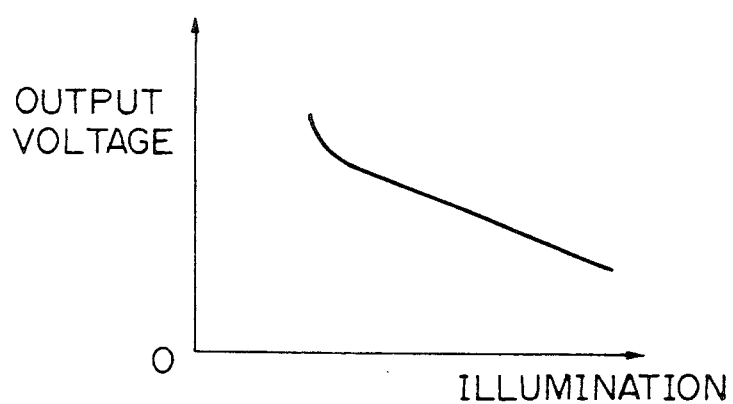
FIGS. 13A and 13B are graphs showing the relation between the illumination and the output voltage in each of the cases where the set potentials of control electrode lines are lower than the potential of the signal line in the embodiment and where they are higher than the potential of the signal line, respectively.
Figure 13B:
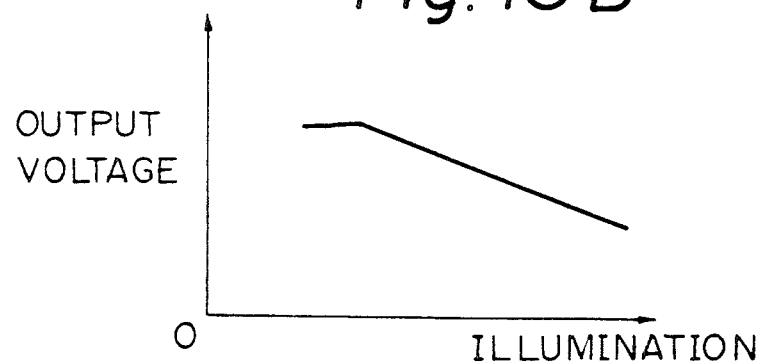

FIGS. 13A and 13B are graphs showing the change in output voltage in each of the cases where the set potentials of the control electrode lines are lower than the potential of the signal line and where they are higher than the potential of the signal line, respectively.

In the case of FIG. 13A, since the set potentials $V_c'$ and $V_c''$ of the control electrode lines 206 and 207 are lower than the potential of the signal line 5, a current flows out of the signal line 5 and there is such a tendency that the output voltage increases in the micro-level signal range. On the other hand, in the case of FIG. 13B, the current contrarily flows into the signal line 5 and there is such a tendency that the output voltage decreases in the micro-level signal range.

Figure 1:
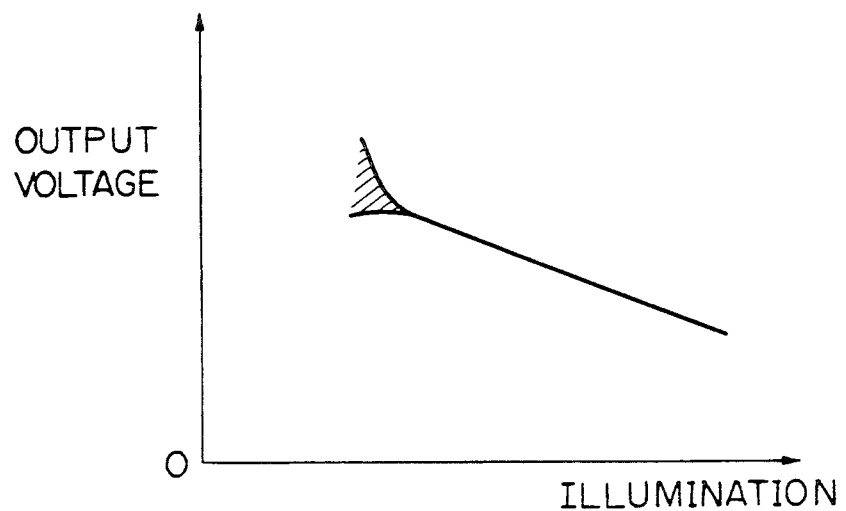
FIG. 1 is a graph showing the relation between the illumination and the output voltage in the case of the photodiode and log amplifier having no control electrode line.

However, in any of those cases, such a variation as shown in FIG. 1 does not occur in the output voltage. The accurate output signal can be easily obtained by providing the correcting circuit.

Further, by adjusting the distances among the signal line 5 and the control electrode lines 206 and 207, the inflow of a leakage current and a current from the outside can be prevented and the output voltage which accurately corresponds to the incident light amount can be obtained without providing the correcting circuit.

The invention is not limited to this embodiment but can be also applied to the semiconductor apparatus which intends to accurately transmit and process the micro-level signal.

As described in detail above, in the semiconductor apparatus according to the embodiment, by providing the control electrode means which were set to desired constant potentials, a variation in signal level on the signal line can be suppressed and the signal can be accurately transmitted and processed.

Further, by properly deciding the distances among the control electrode means and the signal line, the leakage current and inflow current can be also controlled. The signal transmitting and processing capabilities at the micro signal level can be improved. Therefore, the correcting circuit which has conventionally been needed can be omitted and the constitution and manufacturing steps can be also simplified.

Figure 14:
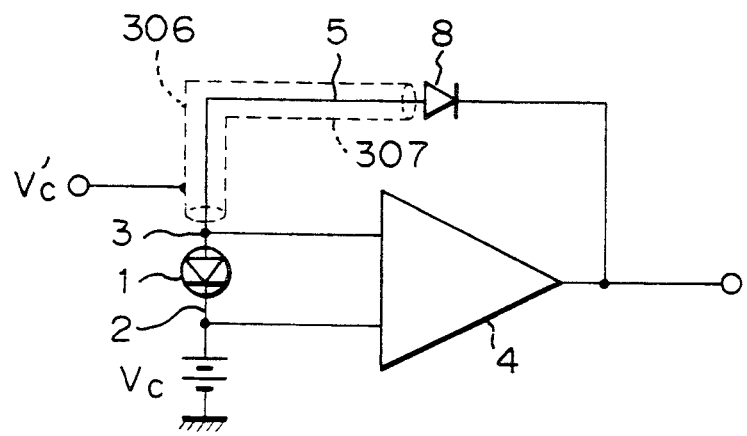
FIG. 14 is a schematic equivalent circuit diagram of the photosensor apparatus as still another embodiment of the semiconductor apparatus according to the invention.

FIG. 14 is an equivalent circuit diagram of the photo sensor apparatus as still another embodiment of the semiconductor apparatus according to the invention.

This embodiment has such a constitution that the photodiode is connected to the log amplifier. Namely, in FIG. 14, the cathode electrode 2 and anode electrode 3 of the photodiode 1 are connected to the noninverting terminal and inverting terminal of the operational amplifier 4, respectively. The reference voltage $V_c$ is applied to the cathode electrode 2. The anode electrode 3 is connected to the signal line 5.

Control electrode means 306 and/or 307 are arranged above and/or below the signal line 5. The voltage $V_c'$ is applied to each control electrode means.

The signal line 5 is connected to the output terminal of the operational amplifier 4 through the log diode 8, thereby constituting a log amplifier. In this case, such a log diode that the base and collector of a bipolar transistor are connected is used as the log diode 8.

With this constitution, when the lights enter the photodiode 1, a photovoltaic current flows through the signal line 5 to the log diode 8, so that the logarithm converted output voltage appears to the output terminal of the operational amplifier 4.

Figure 15:
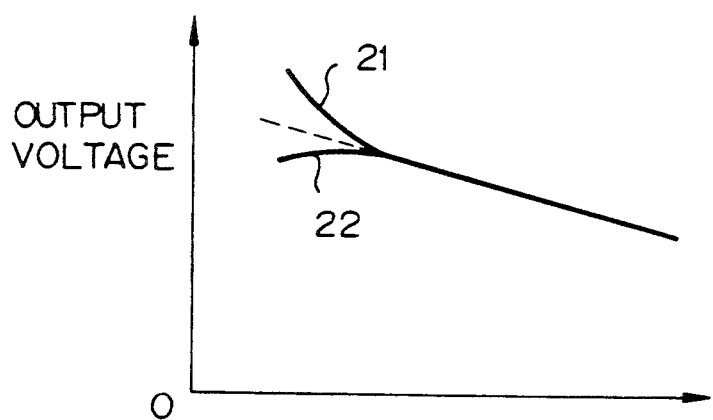
FIG. 15 is a graph showing schematically the output voltage characteristic to the photovoltaic current in each of the embodiment and the prior art.

FIG. 15 is a graph showing the relation of the output voltage to the photovoltaic current. In this graph, a curve 21 indicates the case where the set potential $V_c'$ of the control electrode means 306 and/or 307 is lower than the potential of the signal line 5. In this case, the current flows out of the signal line 5, so that there is such a tendency that the output voltage increases in the micro-level signal range. On the contrary, a curve 22 in the graph represents the case where the set potential $V_c'$ is higher than the potential of the signal line 5. In this case, there is such a tendency that a current flows into the signal line 5 and the output voltage in the micro-level signal range decreases.

However, in any of those cases, a variation as in the conventional apparatus does not occur in the output voltage between the voltage levels indicated by the curves 21 and 22. By providing the correcting circuit, the accurate output signal can be easily obtained. In addition, by changing the potential of the control electrode means, the points at which the curves 21 and 22 start bending can be also controlled.

Further, by adjusting the distances among the signal line 5 and the control electrode means 306 and 307, the inflow of leakage current and a current from the outside can be prevented. The output voltage which accurately corresponds to the incident light amount can be obtained without providing the correcting circuit On the other hand, practical examples of the control electrode means of the embodiment can be constituted similarly to the practical examples of the guard means shown in, e.g., FIGS. 6 to 10.

As described in detail above, in the semiconductor apparatus according to the foregoing embodiment, by providing the control electrode means which were set to desired constant potentials similarly to the foregoing embodiment, the variation in signal level on the signal line can be suppressed and the signal can be accurately processed.

We claim:

1. A semiconductor apparatus comprising:
   a semiconductor substrate;
   a generating means for generating a signal, said generating means being coupled to an operational amplifier;
   a signal line arranged on said semiconductor substrate for transmitting the signal generated by said signal generating means; and
   guard means comprising a conductive region in the vicinity of and surrounding said signal line, wherein a potential of said guard means is substantially equal to a potential of said signal line.

2. A semiconductor apparatus according to claim 1, wherein said guard means surrounding said signal line comprises a metal layer provided above said signal line.

3. A semiconductor apparatus according to claim 1, wherein said semiconductor has a first conductivity type, and wherein said guard means surrounding said signal line is a material selected from the group consisting of a conductive metal and a semiconductor having a conductivity type opposite to the first conductivity type of said semiconductor substrate.

4. A semiconductor apparatus comprising:
   a semiconductor substrate;
   a generating means for generating a signal, said generating means being coupled to an operational amplifier;
   a signal line arranged on said semiconductor substrate for transmitting the signal generated by said signal generating means; and
   control electrode means, comprising a conductive region in the vicinity of and surrounding said signal line, wherein said control means sets a potential of said conductive region to a predetermined constant potential, and wherein the predetermined constant potential is substantially equal to a potential of said signal line.

5. A semiconductor apparatus according to claim 4, wherein said control electrode means surrounding said signal line comprises a metal layer provided above said signal line.

6. A semiconductor apparatus according to claim 4, wherein said semiconductor substrate has a first conductivity type, and wherein said control electrode means surrounding said signal line is a material selected from the group consisting of a conductive metal and a semiconductor having a conductivity type opposite to the first conductivity type of said semiconductor substrate.

7. A semiconductor apparatus according to claim 1, wherein said signal generating means comprises a photodiode.

8. A semiconductor apparatus according to claim 4, wherein said signal generating means comprises photodiode.

* * * * *

UNITED STATES PATENT AND TRADEMARK OFFICE
CERTIFICATE OF CORRECTION

PATENT NO. : 5,150,189

DATED : September 22, 1992

INVENTOR(S) : TAKAHIRO SHIRAI ET AL.

Page 1 of 2

It is certified that error appears in the above-identified patent and that said Letters Patent is hereby corrected as shown below: Title page:

<u>AT [75] INVENTORS</u>

"Tsuneori Yoshinari" should read --Tsunenori Yoshinari--.

<u>COLUMN 1</u>

Line 31, "side" should read --side.--.

<u>COLUMN 3</u>

Line 4, "lights enter" should read --light enters--.
Line 42, "photo" should read --photo- --.
Line 59, "tansis-" should read --transis- --.
Line 61, "lights enter" should read --light enters--.

<u>COLUMN 5</u>

Line 14, "photo sensor" should read --photo-sensor--.
Line 34, "tansis-" should read --transis- --.
Line 36, "lights enter" should read --light enters--.

<u>COLUMN 6</u>

Line 15, "photo" should read --photo- --.
Line 66, "circuit" should read --circuit.--.

UNITED STATES PATENT AND TRADEMARK OFFICE
CERTIFICATE OF CORRECTION

PATENT NO. : 5,150,189

DATED : September 22, 1992

INVENTOR(S) : TAKAHIRO SHIRAI ET AL.

It is certified that error appears in the above-identified patent and that said Letters Patent is hereby corrected as shown below:

COLUMN 8

Line 31, "comprises" should read --comprises a--.

Signed and Sealed this

Sixth Day of July, 1993

Attest:

MICHAEL K. KIRK

Attesting Officer

Acting Commissioner of Patents and Trademarks